US009003101B1

(12) United States Patent
Fallone et al.

(10) Patent No.: US 9,003,101 B1
(45) Date of Patent: Apr. 7, 2015

(54) PRIORITIZED ACCESS FOR MEDIA WITH HETEROGENEOUS ACCESS RATES

(75) Inventors: Robert M. Fallone, Newport Beach, CA (US); William B. Boyle, Lake Forest, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 165 days.

(21) Appl. No.: 13/172,737

(22) Filed: Jun. 29, 2011

(51) Int. Cl.
*G06F 12/00* (2006.01)
*G06F 12/08* (2006.01)

(52) U.S. Cl.
CPC .................. *G06F 12/0802* (2013.01)

(58) Field of Classification Search
USPC .......................................... 711/102, 103, 170
See application file for complete search history.

(56) References Cited

U.S. PATENT DOCUMENTS

| | | | | |
|---|---|---|---|---|
| 5,999,351 A * | 12/1999 | Albrecht et al. | | 360/48 |
| 6,185,063 B1 | 2/2001 | Cameron | | |
| 6,502,178 B1 * | 12/2002 | Olbrich | | 711/202 |
| 7,443,630 B2 | 10/2008 | Lengsfield, III et al. | | |
| 7,486,460 B2 | 2/2009 | Tsuchinaga et al. | | |
| 7,620,772 B1 | 11/2009 | Liikanen et al. | | |
| 8,370,597 B1 * | 2/2013 | Chatterjee et al. | | 711/170 |
| 2005/0069298 A1 | 3/2005 | Kasiraj et al. | | |
| 2005/0071537 A1 | 3/2005 | New et al. | | |
| 2006/0090055 A1 * | 4/2006 | Itoh | | 711/170 |
| 2006/0232847 A1 | 10/2006 | Hirooka et al. | | |
| 2006/0232874 A1 | 10/2006 | Tsuchinaga et al. | | |
| 2007/0223132 A1 | 9/2007 | Tsuchinaga | | |
| 2008/0126680 A1 * | 5/2008 | Lee et al. | | 711/103 |
| 2008/0215800 A1 * | 9/2008 | Lee et al. | | 711/103 |
| 2008/0235467 A1 * | 9/2008 | Tagawa | | 711/154 |
| 2009/0055582 A1 * | 2/2009 | Bish et al. | | 711/111 |
| 2009/0172258 A1 | 7/2009 | Olbrich et al. | | |
| 2009/0307424 A1 * | 12/2009 | Galloway et al. | | 711/114 |
| 2009/0327590 A1 | 12/2009 | Moshayedi | | |
| 2009/0327591 A1 | 12/2009 | Moshayedi | | |
| 2010/0115192 A1 * | 5/2010 | Lee | | 711/103 |
| 2010/0161928 A1 * | 6/2010 | Sela et al. | | 711/163 |
| 2010/0169541 A1 * | 7/2010 | Freikorn | | 711/103 |
| 2010/0232057 A1 * | 9/2010 | Sanvido et al. | | 360/78.04 |
| 2010/0262755 A1 | 10/2010 | Becker et al. | | |
| 2010/0281230 A1 * | 11/2010 | Rabii et al. | | 711/165 |
| 2011/0153270 A1 * | 6/2011 | Hoffman | | 702/179 |
| 2012/0079232 A1 * | 3/2012 | Hinton et al. | | 711/207 |

\* cited by examiner

*Primary Examiner* — Aracelis Ruiz

(57) ABSTRACT

A non-volatile storage subsystem is described which identifies performance-sensitive commands and heterogeneous performance characteristics of portions of a non-volatile storage media, and matches the performance sensitivity of the commands with an available physical write address corresponding to performance characteristics appropriate for the performance sensitivity of the command. A command can be considered performance sensitive if it originates from a host or a preferred host among a plurality of hosts, or if the command designates a frequently accessed logical address. Performance characteristics of the storage device can be determined by physical architectures of the storage media such as the distance from the axial center of a disk media, or the architecture technology of a solid-state array. Performance characteristics can also be determined dynamically and heterogeneous performance can be encouraged by internal maintenance policies of the subsystem.

19 Claims, 4 Drawing Sheets

PRIORITIZED ACCESS FOR MEDIA WITH HETEROGENEOUS ACCESS RATES

BACKGROUND

1. Technical Field

This disclosure relates to storage media with heterogeneous media access characteristics, including media in storage devices such as hard disks, solid-state devices, and hybrid drives.

2. Description of Related Art

In many storage systems, address indirection is used to decouple the logical address used by a host from the physical address actually storing the storage data. In these systems, a mapping table typically provides a logical to physical mapping to translate a logical to a physical address. When a write is performed, the system must choose and designate a physical address for the write command.

BRIEF DESCRIPTION OF THE DRAWINGS

Systems and methods which embody the various features of the invention will now be described with reference to the following drawings, in which.

DETAILED DESCRIPTION

While certain embodiments of the inventions are described; these embodiments are presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions.

System Overview

Embodiments of the invention are directed to systems and methods for assigning a physical write address from a heterogeneous media array which includes high and low performance portions. For example, in certain hard disks, the read and write speeds for various portions of the disk may differ according to the physical location of the various portions on the disk. In a solid-state storage array, a solid-state storage array can comprise a plurality of differing access characteristics (e.g. program speed) which may be due to usage, manufacturing differences, or individual package characteristics. Performance characteristics of a write command can be determined to guide the selection of a physical write address. That is, write commands with a high performance sensitivity can be preferentially assigned to portions of the media with higher write performance characteristics, thus improving the performance of these commands compared to a system that designates physical addresses without considering performance characteristics of the physical write locations.

Storage systems often make use of address indirection by assigning a physical address to a logical address for storage used by a host. In prior systems without address indirection, the logical address used by a host corresponded directly to the physical storage address on the storage media. Address indirection is performed on a variety of media. For example, solid-state storage systems typically use address indirection in order to provide support for wear leveling, garbage collection, and other techniques to maintain performance of the storage media. Likewise, address indirection may be used on a hard disk in order to allow portions of the disk to be preferentially written, or in the case of a shingled hard drive, it may allow sequential writes to physical portions of the disk which do not correspond to sequential logical addresses of write commands.

Figure 1:
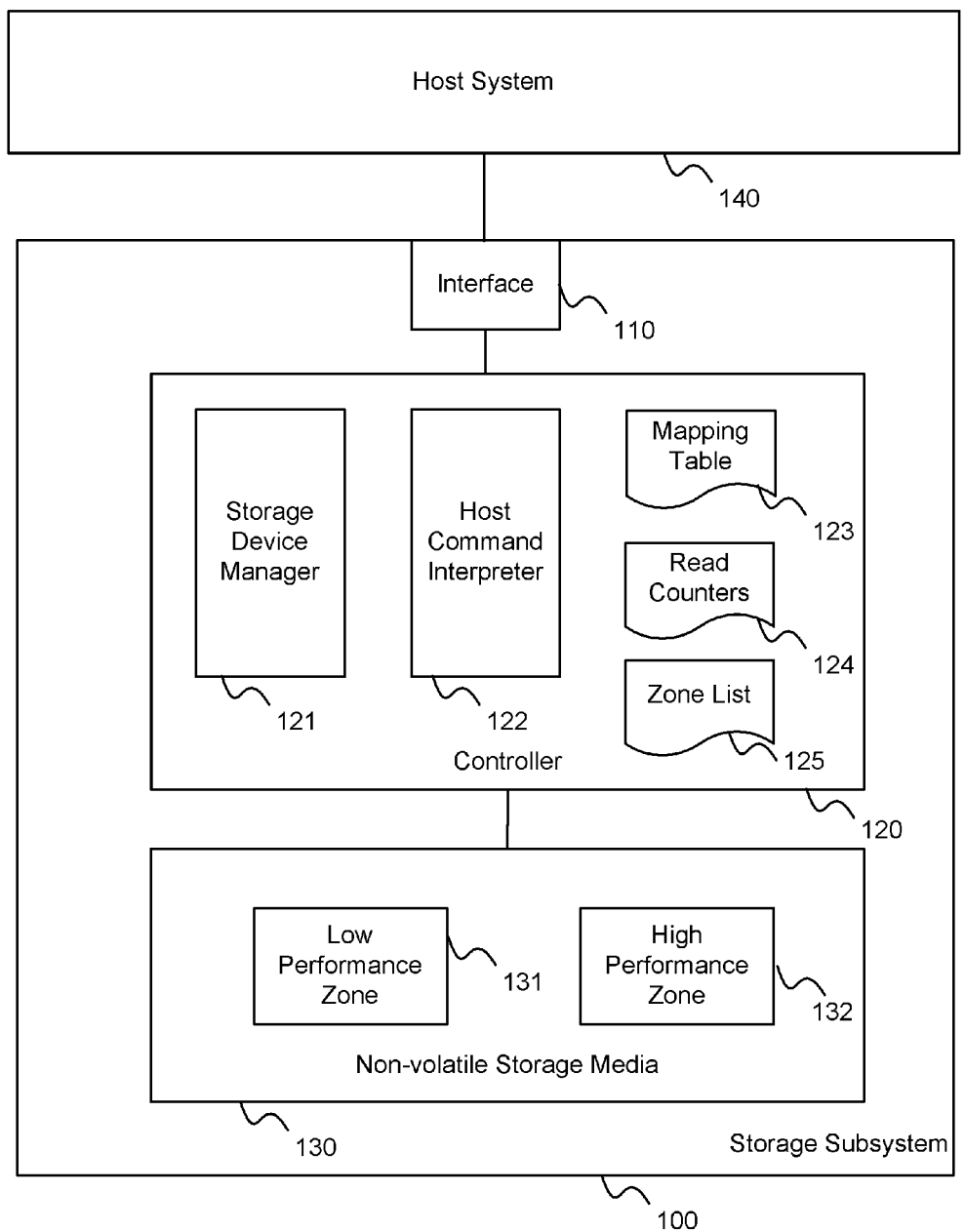
FIG. 1 illustrates an overview of a storage system according to an embodiment.

Referring now to FIG. 1, a storage system is shown according to an embodiment. In this embodiment, a storage subsystem 100 is connected to a host system 140. The host system 140 can provide commands to the storage subsystem 100 which are received at an interface 110 on the storage subsystem 100. The commands can then be transferred to a controller 120 which is responsible for interpreting and responding to the commands. The controller 120 may include several components, such as a storage device manager 121 and host command interpreter 122. The controller 120 and its components may be implemented as modules in software executed by a processor or a plurality of processors, or may be implemented in hardware circuits, or a combination of the two according to a designer's preference.

The host command interpreter 122 can receive the commands from the interface 110. In one embodiment, when the host command interpreter 122 receives a write command which designates a logical address, the controller 120 determines a physical address on a non-volatile storage media 130 to store the data. The non-volatile storage media can be a hard disk (a rotational platter media), a solid-state storage array, or a mixture of the two. The non-volatile storage media 130 may include at least one low performance zone 131 and at least one high performance zone 132.

The low and high performance zones 131 and 132 on the non-volatile storage media can be determined in a wide variety of ways, and may be determined dynamically by the controller. For example, in a hard disk embodiment, typically the inner portions (inner diameter or "ID") of a platter are typically characterized by a slower data write rate compared to the outer portions (outer diameter or "OD"). In addition, each side of a disk platter may be characterized by differing data write rates, as may each platter in a plurality of disk platters in a storage device. The differing data rates for each platter may be determined at manufacturing time, or measured by the controller during operation. In a solid-state storage array embodiment, a single storage device may include several memory technologies, such as multi-level cell (MLC) and single-level cell (SLC) which each includes different performance characteristics. For example, programming a SLC is typically faster than programming a MLC. In one embodiment, the designation of "low" and "high" performance zones 131 and 132 on the non-volatile storage media 130 is a relative determination according to the available performance zones on the non-volatile storage media 130. That is, portions of the non-volatile storage media may have improved or decreased performance relative to other portions of the non-volatile storage media 130. The controller 120 may reference a record of read counters 124 to determine portions of the non-volatile storage media which have been read more frequently than other portions, which may result in decreased write performance. Read counters 124 may alternatively or additionally record which logical addresses are more frequently accessed by the host and the controller may designate writes addressing these logical addresses as preferentially written to the high performance zone 132. In other embodiments, write and erase counters may also be used to keep track of decreased performance due to wear from write and/or erase operations. Further factors related to determinations of high and low performance zones 131 and 132 on the non-volatile storage media 130 are described below, particularly with reference to FIG. 4.

The controller may include data such as the read counters 124, a mapping table 123, and an available zone list 125. Such data may be stored in volatile memory such as SRAM or DRAM, and a persistent version of the data may be stored in the non-volatile storage media 130. The mapping table 123 may include a table for translating the logical addresses to physical addresses. The available zone list 125 may be a list of zones available for writing. When a write command designating a logical address requires a physical address, a physical address may be chosen from the available zone list 125 and the chosen physical address may then be removed from the zone list 125. The storage device manager 121 in one embodiment is responsible for maintaining the storage subsystem, and may provide for internal management tasks, such as storage system maintenance, garbage collection, wear leveling, power-on testing, and other tasks. As such, the storage device manager 121 may also request writes to the non-volatile storage media. Typically, write requests coming from the storage device manager 121 are not performance sensitive. In contrast, the user at the host system 140 is sensitive to the rate at which write commands submitted from the host system 140 are processed by the storage subsystem 100. As such, it may be preferable for write commands originating from the host system 140 to be assigned a physical location associated with the high performance zone 132 and commands originating from the storage device manager 121 to be assigned a physical location associated with the low performance zone 131. In an embodiment, the zone list 125 maintains a prioritized list of the available portions of non-volatile storage media 130 ordered according to performance characteristics. According to the performance sensitivity of the write command, an appropriate available zone may be chosen from the zone list 125.

Heterogeneous Media

Figure 2:
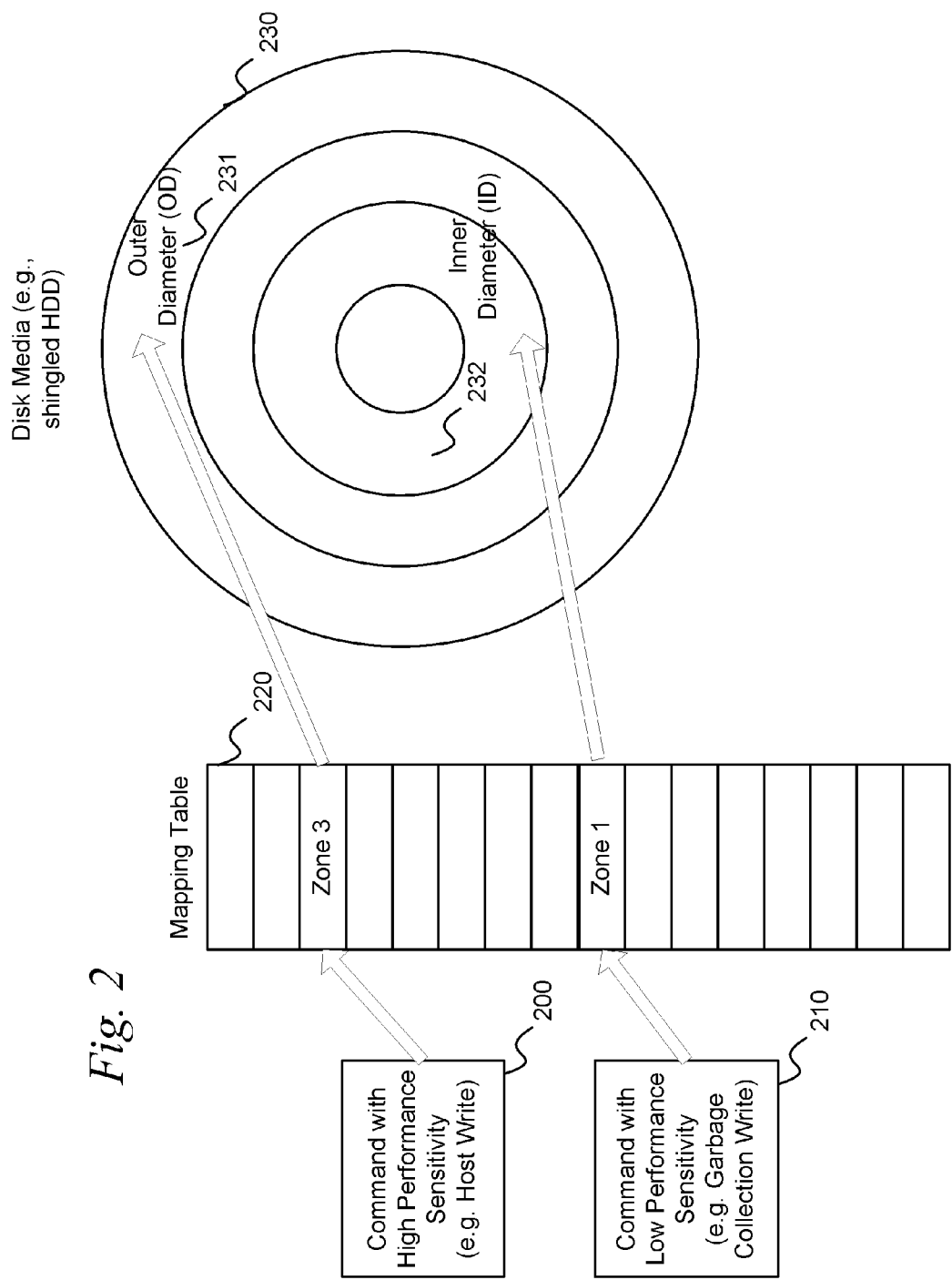
FIG. 2 illustrates designating a physical address for a hard disk with heterogeneous performance zones according to an embodiment.

Referring now to FIG. 2, the assignment of write commands to particular physical write locations according to an embodiment is shown. In this example, two write commands are shown, a high performance sensitivity write command 200 and a low performance sensitivity command 210. In some embodiments, performance sensitivity may be determined by a variety of factors, and may have a finer granularity than "low" and "high. For example, performance sensitivity can be rated on a scale based on a variety of factors to produce a performance sensitivity score (e.g. ranging from 1-10). One example of a high sensitivity command 200 may be a command originating from a host. An example of a low sensitivity command 210 may be a command originating from an internal storage system process, such as a garbage collection-related write command or a wear leveling-related write command. In some embodiments, other sources for performance sensitivity are possible. For example, certain internal commands may be assigned a higher write performance factor, such as a garbage collection command issued when remaining free space is very limited. In addition, in a system providing non-volatile storage for a plurality of hosts, certain hosts may be designated with higher or lower priority factors relative to other command originators. A host may also designate via a command parameter whether a particular command is to be treated with a special performance sensitivity that can raise or lower the performance sensitivity of the command as determined by the controller.

In addition, a performance sensitivity may be associated with a particular logical address for a duration. For example, the host may indicate a high performance sensitivity when it sends a write command. The logical address for this write command may now have an associated high performance flag. This high performance flag can ensure that the logical address receives high performance treatment when it is re-mapped to another physical address by an internal process. A future write request to that logical address can change the performance sensitivity of the logical address. The performance designation may be a value in a range of performance sensitivities rather than a single flag. The performance sensitivity value may be stored with the mapping table or in a separate address sensitivity table.

The example in FIG. 2 shows a disk media 230 with an OD region 231 and an ID region 232. The OD region 231 is characterized by a higher write performance compared to the ID region 232. As such, OD region 231 can be considered a "high" performance region of the write media compared to the ID region 232. In certain disk media, the OD region 231 can perform up to twice the data write rate of ID region 232. A variety of other means to determine higher and lower performance regions of media are described throughout this application.

When the write commands 200 and 210 are received, the high performance sensitivity command 200 is preferentially written to the high performance zone (OD region 231) of the disk media 230 and the low performance sensitivity command 210 is preferentially written to the low performance zone (ID region 232). The assigned write zones may be recorded in the mapping table 220. In this way, host (and other high priority request) responsiveness can be maximized.

Figure 3:
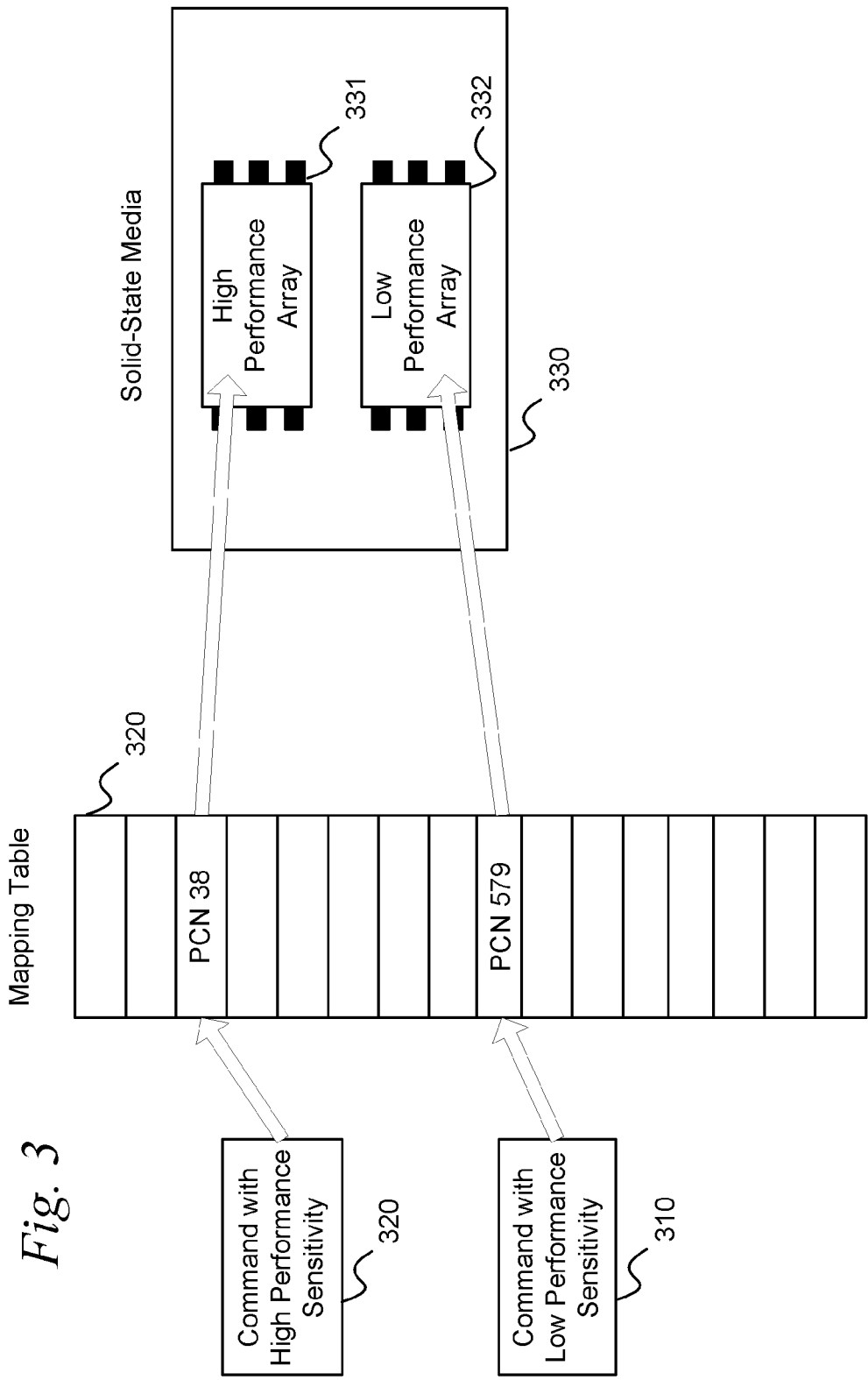
FIG. 3 illustrates designating a physical address for a solid-state disk with heterogeneous performance zones according to an embodiment.

Referring to FIG. 3, a solid-state storage device with heterogeneous media according to an embodiment is shown. As with FIG. 2, a high and a low performance sensitivity command 300 and 310 are received and can be preferentially designated to high and low performance arrays 331 and 332, respectively. In this example, the solid-state media 330 includes a high performance array 331 and a low performance array 332. In this example, the high performance array 331 is disposed on a separate package from the low performance array 332. In other embodiments, determinations of high and low performance can be determined among various planes of a die or within particular blocks of a plane or any other granularity. In this embodiment, the high performance array 331 may comprise for example an SLC architecture and the low performance array 332 may comprise an MLC architecture. At a coarse granularity, each architecture provides different performance characteristics. Typically, an SLC package provides faster programming times at the expense of additional cost. An advantage of this heterogeneous design may be to reduce the cost of a certain capacity of solid-state media by combining SLC and MLC architectures, while maintaining faster access rates typically associated with an SLC-only design. While host writes can be primarily directed to high performance array 331, internal management may relocate this data to the low performance array 332 to free the high performance array 331 and thereby maintain high access performance for the host. Similar techniques could be used, for example, in a drive comprising a solid-state array and a hard disk media. Host writes could preferentially be directed to the solid-state array and internal management commands could preferentially be directed to the hard disk portion.

Write Address Selection

Figure 4:
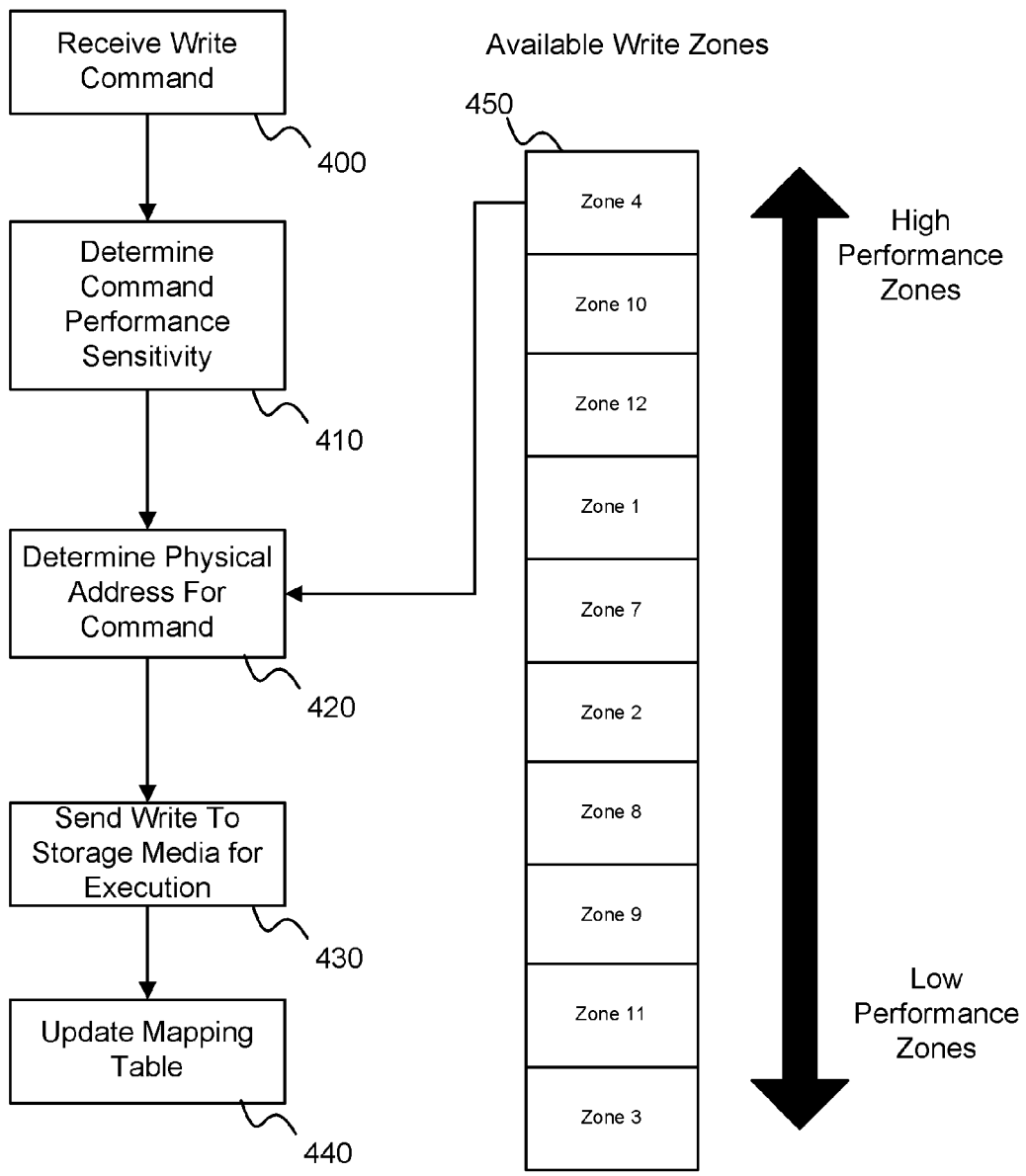
FIG. 4 illustrates a process for selecting a physical write location according to an embodiment.

Referring now to FIG. 4, an embodiment is presented of a process for processing a write command. This process may be performed, for example, by the controller 120 shown in FIG. 1. This process may be executed, for example, by a component of the controller 120 responsible for assigning one or more physical addresses to a write command. The write command described in FIG. 4 may be a write command from a variety of command originators, such as other components of the controller 120 or a variety of host systems.

At block 400, a write command is received. At block 410, the performance sensitivity of the command is determined. The performance sensitivity can be determined by a variety of factors, such as the source of the write command or any performance sensitivity flags accompanying the command or by other means as described in this disclosure. The performance sensitivity of the command may be Boolean (high or low) or may constitute a value in a range. The performance sensitivity can be determined with reference, for example, to the origin of the write command or the frequency of accesses to the logical memory location. For example, read frequency may be determined with reference to read counters. In one embodiment, a write command directed to a logical memory address which is frequently read (by a host or other internal processes) may be treated as a high performance sensitive command even if the command is being requested by an internal storage system process.

Next, at block 420, a physical address can be selected for the write command by taking into account the performance sensitivity of the command determined at block 410. The physical address may be chosen from a list of available write zones 450. The list of available write zones 450 may be organized in a list that orders the available physical addresses according to performance characteristics. The available write address chosen to fulfill the command is chosen from the ordered list in part based on the performance sensitivity of the command. For example, a high performance sensitivity command may be designated the available write zone at the end of the list with the highest write performance. Likewise, a low performance sensitivity command may be designated the available write zone at the end of the list with the lowest write performance. For a system implementing a range of sensitivities, a command with a medium level of write sensitivity may receive a physical address corresponding to an available write zone located at neither end of the available write zone list, instead receiving a write zone with medium performance characteristics, such that the highest performance zones are available for future high performance writes.

After designating a physical address location at block 420, the write command can proceed to the storage media for programming at block 430. Next, the mapping table can be updated at block 440 to indicate the physical address that stores data associated with the logical address for the write command.

Write Performance Characterization

A wide variety of factors may be considered in determining the write performance of portions of the storage media. As described above, these may include fundamental differences such as the different performance characteristics due to the radial distance from the center on a hard disk or the solid-state architecture choice for a solid-state system. Differences in write performance may also be determined dynamically during operation of the storage device. Further, the write performance can be a combination of several factors. For example, the controller may track write command durations to determine if the delay for a write command has increased over time. In a hard disk storage device, the rotational position of the disk relative to the write head may also be used to determine performance character of writing to a portion. That is, an ID portion that is closer to the write head (e.g. taking into account of disk rotational direction) may be preferred over an OD portion that requires the disk to rotate further to reach the write head.

In further embodiments, the controller may maintain certain portions of high performance zones. For example, in a system where the memory storage device may degrade in performance after use, the controller may designate a portion of physical memory on which wear is kept at a reduced level to preserve performance. The controller may use, for example, a wear leveling algorithm that wear levels certain portions of the physical storage media (e.g., a solid state storage array) while maintaining certain portions with reduced write/erase counts. These portions with reduced write/erase counts can then be reserved for high performance sensitivity commands. As such, the controller may operate to emphasize a heterogeneous character of a storage device to create over time portions of the device which have improved write characteristics compared to other portions of the device.

CONCLUSION

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, those skilled in the art will appreciate that in various embodiments, the actual steps taken in the processes shown in FIG. 4 may differ from those shown in the figures. Depending on the embodiment, certain of the steps described in the example above may be removed, others may be added, and the sequence of steps may be altered and/or performed in parallel. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A non-volatile storage subsystem, comprising:
non-volatile storage media comprising a solid-state storage array, the non-volatile storage media including a higher write performance portion and a lower write performance portion; and
a controller configured to:
perform wear leveling operations on the solid-state storage array;
designate at least one portion of the solid-state storage array as a portion with reduced wear compared to other portions of the solid-state storage array and maintain the designated at least one portion of the solid-state storage array as the portion with reduced wear compared to the other portions of the solid-state storage array, the higher write performance portion comprising the designated at least one portion of the solid-state storage array;

maintain a list of available storage locations for the non-volatile storage media;

receive a write command comprising a logical address and write data;

determine a performance sensitivity associated with the write command, the write command having a higher performance sensitivity when it is received from a host system and having a lower performance sensitivity when it is received from a maintenance process internal to the non-volatile storage subsystem; and in response to determining that the write command has the higher performance sensitivity, execute the write command in a storage location of the designated at least one portion of the solid-state storage array chosen from the list of available storage locations.

2. The non-volatile storage subsystem of claim 1, wherein the non-volatile storage media further comprises a hard disk device, the higher write performance portion comprising a first portion of the hard disk device and the lower write performance portion comprising a second portion of the hard disk device, and the controller is further configured to:

receive another write command, in response to determining that the another write command has the higher performance sensitivity, execute the another write command in the first portion of the hard disk device, and in response to determining that the another write command has the lower performance sensitivity, execute the another write command in the second portion of the hard disk device.

3. The non-volatile storage subsystem of claim 2, wherein the hard disk device comprises a hard disk platter, the first portion of the hard disk device comprising an outer diameter region of the hard disk platter and the second portion of the hard disk device comprising an inner diameter region of the hard disk platter.

4. The non-volatile storage subsystem of claim 2, wherein the hard disk device comprises a plurality of hard disk platters, and the first and second portions of the hard disk device are defined by different performance characteristics of different surfaces of the plurality of hard disk platters.

5. The non-volatile storage subsystem of claim 2, wherein the hard disk device comprises a hard disk platter, and the first and second portions of the hard disk device are assigned based at least in part by a current rotational position of a portion of the hard disk platter relative to a write head of the hard disk device.

6. The non-volatile storage subsystem of claim 1, wherein the controller is further configured to store, in the designated at least one portion of the solid-state storage array, data addressed by frequently written logical addresses.

7. The non-volatile storage subsystem of claim 1, wherein the non-volatile storage media comprises a plurality of solid-state storage arrays including the solid-state storage array.

8. The non-volatile storage subsystem of claim 7, wherein the higher write performance portion includes a Single-Level Cell (SLC) storage array of the plurality of solid-state storage arrays and the lower write performance portion includes a Multi-Level Cell (MLC) storage array of the plurality of solid-state storage arrays.

9. The non-volatile storage subsystem of claim 1, wherein the performance sensitivity of the write command is based at least partly on whether the logical address is a frequently accessed logical address.

10. The non-volatile storage subsystem of claim 1, wherein the determined performance sensitivity corresponds to one performance sensitivity value of more than two performance sensitivity values.

11. A method for assigning a physical address location to a write command in a non-volatile storage subsystem, comprising:

performing wear leveling operations on a solid-state storage array;

designating at least one portion of the solid-state storage array as a portion with reduced wear compared to other portions of the solid-state storage array and maintaining the designated at least one portion of the solid-state storage array as the portion with reduced wear compared to the other portions of the solid-state storage array;

maintaining a list of available physical address locations of non-volatile storage media including the solid-state storage array, each available physical address location associated with a performance characteristic, the list being organized by the performance characteristic of the available physical address locations;

determining a performance sensitivity associated with the write command;

assigning the physical address location from the available physical address locations to the write command based at least in part on the determined performance sensitivity associated with the write command and the performance characteristic of the physical address location;

wherein when the write command is received from a host, the write command is deemed to have a high performance sensitivity and is assigned an available physical address from the list corresponding to the designated at least one portion of the solid-state storage array, wherein when the write command is received from a management process internal to the non-volatile storage subsystem, the write command is deemed have a low performance sensitivity and is assigned an available physical address from the list corresponding to a portion of the solid-state storage array other than the designated at least one portion of the solid-state storage array, wherein the method is performed by a controller in the non-volatile storage subsystem.

12. The method of claim 11, wherein the determination of the performance sensitivity of the write command is based partly on whether the write command designates a frequently accessed logical address.

13. A non-volatile storage system comprising:

non-volatile storage media comprising a solid-state storage array, the non-volatile storage media including a higher write performance portion and a lower write performance portion; and a controller configured to:

perform wear leveling operations on the solid-state storage array;

designate at least one portion of the solid-state storage array as a portion with reduced wear compared to other portions of the solid-state storage array and maintain the designated at least one portion of the solid-state storage array as the portion with reduced wear compared to the other portions of the solid-state storage array, the higher write performance portion comprising the designated at least one portion of the solid-state storage array;

receive a write command from a host;

receive a write command from an internal component;

maintain a list of available write locations for the non-volatile storage media;

assign a write location to the write command from the host chosen from the list of available write locations based at least in part on a preference for assigning available write locations from the higher write performance portion of the non-volatile storage media to write commands from the host, the chosen write location assigned to the write command from the host being a memory location of the designated at least one portion of the solid-state storage array; and assign a write location to the write command from the internal component chosen from the list of available write locations based at least in part on a preference for assigning available write locations from the lower write performance portion of the non-volatile storage media to write commands from the internal component.

14. The non-volatile storage system of claim 13, wherein the non-volatile storage media further comprises a hard disk platter, and the higher write performance portion further comprises an exterior portion of the hard disk platter and the lower write performance portion further comprises an interior portion of the hard disk platter.

15. The non-volatile storage system of claim 13, wherein the non-volatile storage media further comprises a plurality of hard disk platters, and the higher write performance portion further comprises a first of the plurality of hard disk platters and the lower write performance portion further comprises a second of the plurality of hard disk platters.

16. The non-volatile storage system of claim 13, wherein the non-volatile storage media further comprises at least one hard disk platter, and the higher write performance portion further comprises a first surface on the at least one hard disk platter and the lower write performance portion further comprises a second surface on the at least one hard disk platter.

17. A non-volatile storage subsystem, comprising:
non-volatile storage media comprising a solid-state storage array, the non-volatile storage media including a higher write performance portion and a lower write performance portion; and a controller configured to:
perform wear leveling operations on the solid-state storage array;
designate at least one portion of the solid-state storage array as a portion with reduced wear compared to other portions of the solid-state storage array and maintain the designated at least one portion of the solid-state storage array as the portion with reduced wear compared to the other portions of the solid-state storage array, the higher write performance portion comprising the designated at least one portion of the solid-state storage array;
maintain a list of available write locations for the non-volatile storage media;
receive a write command comprising a logical address and write data;
determine a performance sensitivity associated with the write command in part based on a run-time characteristic of the non-volatile storage subsystem and whether the write command is received from a host system or a maintenance process internal to the non-volatile storage subsystem; and
select a write location either in the higher write performance portion or the lower write performance portion of the storage media chosen from the list of available write locations based at least in part on the determined performance sensitivity associated with the write command.

18. The non-volatile storage subsystem of claim 17, wherein the run-time characteristic comprises a remaining storage capacity of the non-volatile storage media.

19. The non-volatile storage subsystem of claim 18, wherein the non-volatile storage media comprises a plurality of solid-state storage arrays including the solid-state storage array, and wherein the higher write performance portion includes a Single-Level Cell (SLC) storage array of the plurality of solid-state storage arrays and the lower write performance portion includes a Multi-Level Cell (MLC) storage array of the plurality of solid-state storage arrays.

* * * * *